United States Patent
Mueller et al.

(10) Patent No.: US 10,254,655 B2
(45) Date of Patent: Apr. 9, 2019

(54) OPTICAL MEMBRANE ELEMENT HAVING A LONGITUDINALLY ADJUSTABLE CONNECTING ELEMENT

(71) Applicant: Carl Zeiss SMT GmbH, Oberkochen (DE)

(72) Inventors: Ulrich Mueller, Aalen (DE); Martin Rath, Adelmannsfelden (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 816 days.

(21) Appl. No.: 14/728,129

(22) Filed: Jun. 2, 2015

(65) Prior Publication Data

US 2015/0277230 A1 Oct. 1, 2015

Related U.S. Application Data

(63) Continuation of application No. 12/748,896, filed on Mar. 29, 2010, now Pat. No. 9,075,321, which is a (Continued)

(30) Foreign Application Priority Data

Oct. 2, 2007 (DE) .................. 10 2007 047 149

(51) Int. Cl.
*G03B 27/52* (2006.01)
*G03F 7/20* (2006.01)
(Continued)

(52) U.S. Cl.
CPC .......... *G03F 7/7015* (2013.01); *G02B 5/208* (2013.01); *G03F 1/64* (2013.01)

(58) Field of Classification Search
CPC ....... G03B 27/58; G03F 1/62; G03F 7/70833; G03F 7/70825; G03F 1/64; H01L 21/683
See application file for complete search history.

(56) References Cited

U.S. PATENT DOCUMENTS 5,068,203 A 11/1991 Logsdon et al.
5,769,984 A 6/1998 Yen et al.
(Continued)

FOREIGN PATENT DOCUMENTS

EP 0 513 859 11/1992
EP 1 510 870 3/2005
(Continued)

OTHER PUBLICATIONS

The International Search Report and a Written Opinion from the counterpart PCT Application No. PCT/EP2008/063170, dated Apr. 27, 2009.
(Continued)

*Primary Examiner* — Mesfin T Asfaw
(74) *Attorney, Agent, or Firm* — Fish & Richardson P.C.

(57) ABSTRACT

An optical membrane element for an optical device in lithography, especially EUV (extreme ultraviolet) lithography, includes at least one membrane layer and a frame, which at least partially surrounds the membrane layer and at which at least part of the rim of the membrane layer is mounted. At least one tautening element is provided, which facilitates tautening of the membrane layer and wherein the optical membrane element can be used in a projection exposure system, especially for EUV lithography, such that the membrane layer of the membrane element can be adjustably tautened, such that the membrane layer is flat. A method for manufacturing a corresponding optical membrane element includes generating a tautening element lithographically together with the membrane layer.

30 Claims, 9 Drawing Sheets

Related U.S. Application Data continuation of application No. PCT/EP2008/063170, filed on Oct. 1, 2008.

(60) Provisional application No. 60/976,900, filed on Oct. 2, 2007.

(51) Int. Cl.
*G03F 1/64* (2012.01)
*G02B 5/20* (2006.01)

(56) References Cited

U.S. PATENT DOCUMENTS

| | | | |
|---|---|---|---|
| 6,101,237 A | 8/2000 | Miyachi et al. | |
| 6,150,060 A | 11/2000 | Vernon | |
| 6,192,100 B1 | 2/2001 | Acosta | |
| 6,683,936 B2 | 1/2004 | Jonkers | |
| 6,749,968 B2 | 6/2004 | Mangat et al. | |
| 7,153,615 B2 | 12/2006 | Bristol et al. | |
| 7,154,666 B2 | 12/2006 | Wedowski et al. | |
| 9,075,321 B2 | 7/2015 | Mueller et al. | |
| 2003/0095245 A1 | 5/2003 | Mishiro et al. | |
| 2004/0061930 A1* | 4/2004 | Wedowski | G03F 7/70158 359/359 |
| 2005/0042153 A1 | 2/2005 | Bristol et al. | |
| 2005/0048376 A1 | 3/2005 | Eschbach et al. | |
| 2006/0033053 A1 | 2/2006 | Lee et al. | |
| 2010/0195076 A1 | 8/2010 | Mueller et al. | |

FOREIGN PATENT DOCUMENTS

| | | |
|---|---|---|
| JP | 03-120047 | 5/1991 |
| JP | 04-163551 | 6/1992 |
| JP | 2006-039409 | 2/2006 |
| WO | WO 2005/029183 | 3/2005 |
| WO | WO 2005/124836 | 12/2005 |

OTHER PUBLICATIONS

European office action for corresponding EP Appl No. 08 835 098.8, dated Sep. 21, 2011.

* cited by examiner

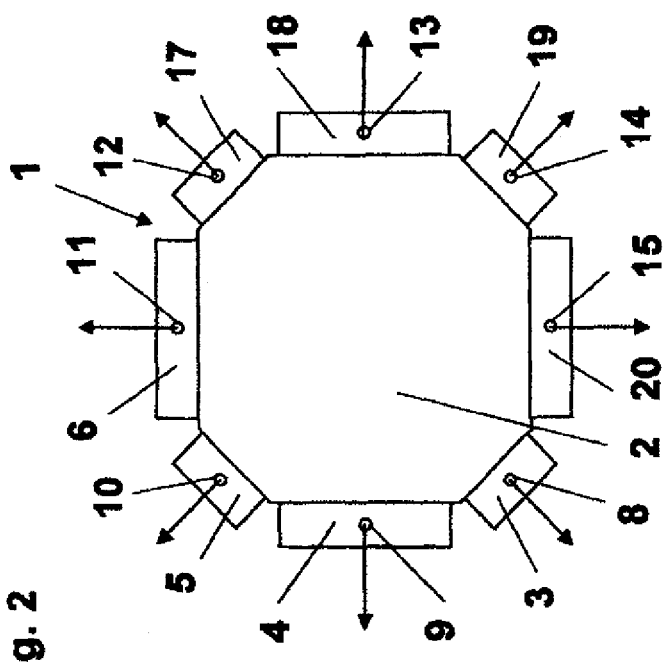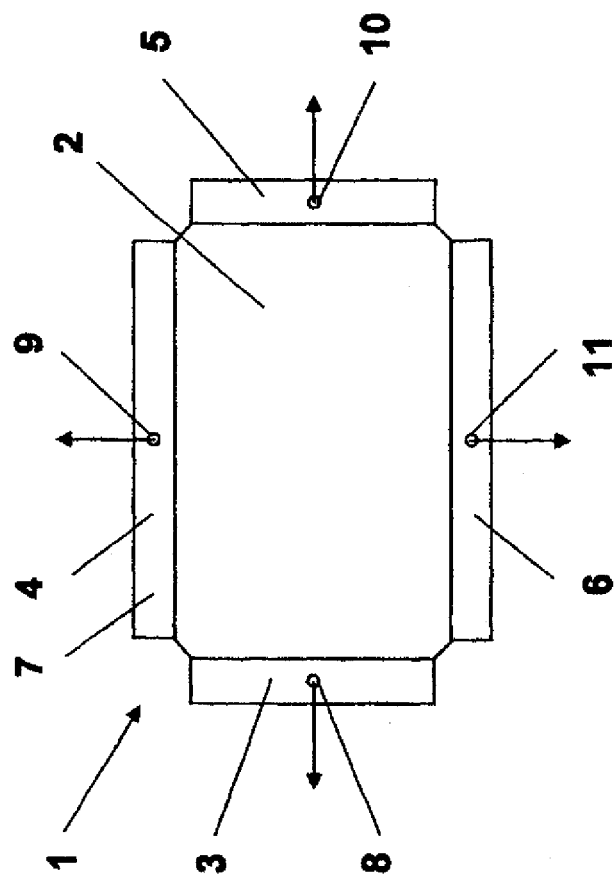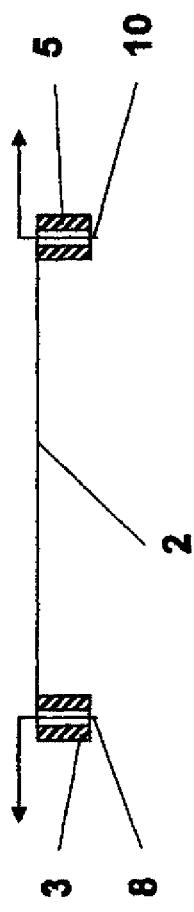

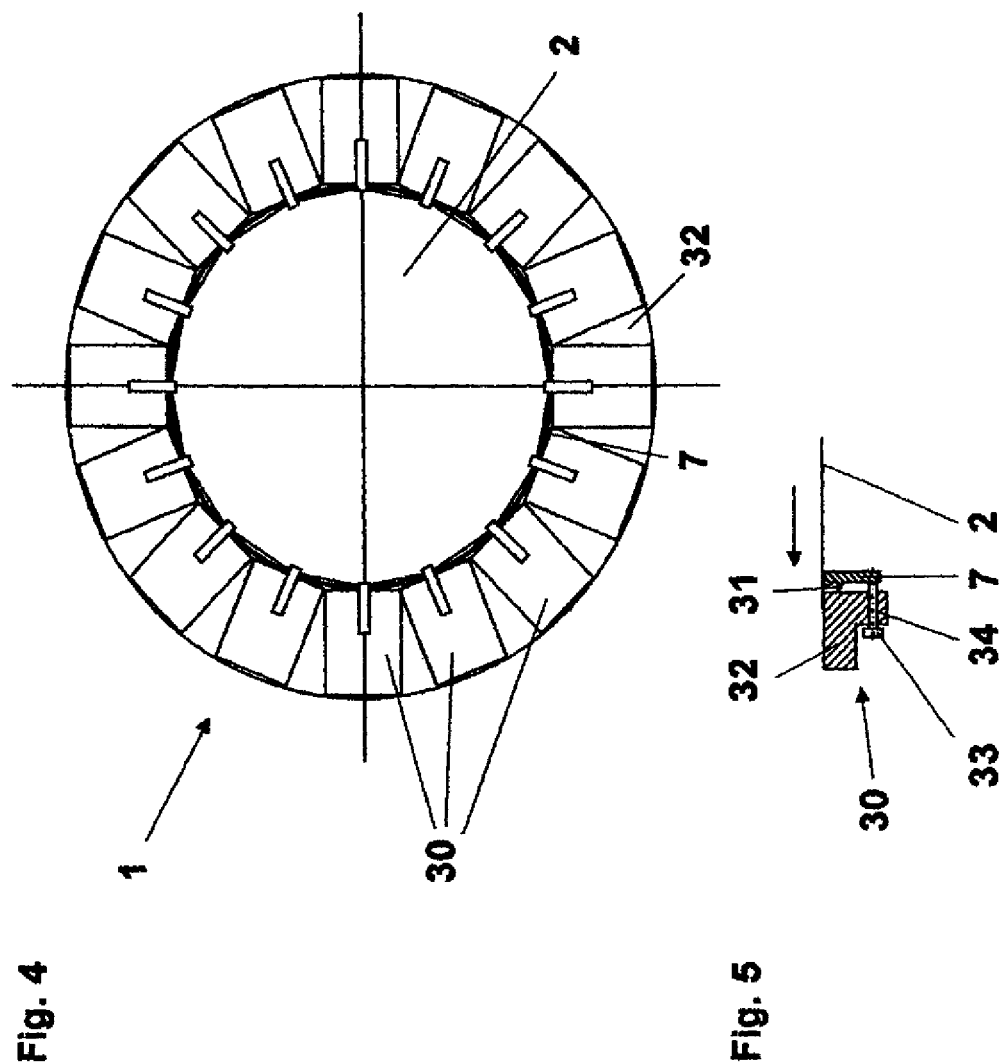

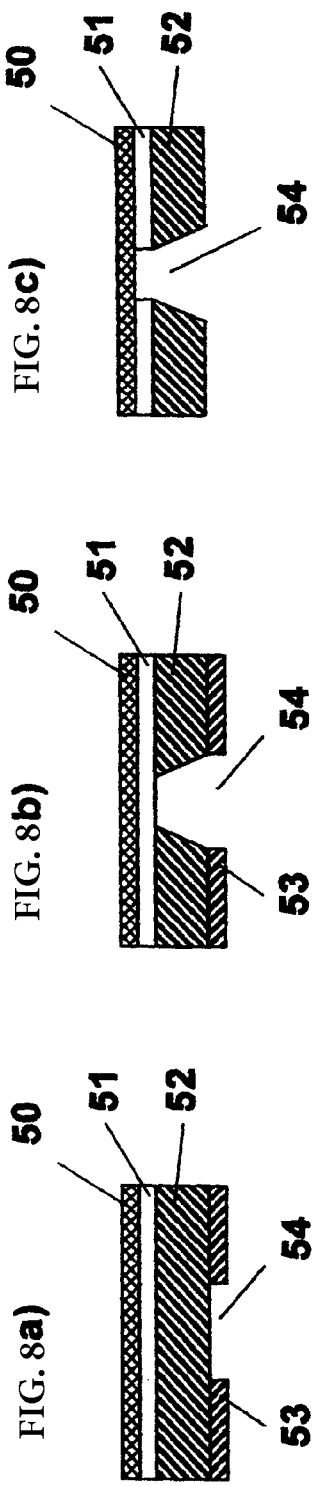
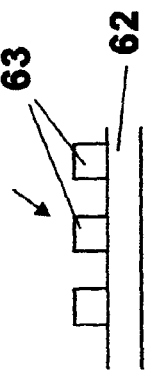
Fig. 9
Fig. 10

OPTICAL MEMBRANE ELEMENT HAVING A LONGITUDINALLY ADJUSTABLE CONNECTING ELEMENT

CROSS-REFERENCE TO RELATED APPLICATIONS

This application is a continuation of, and claims benefit under 35 USC 120 to, U.S. application Ser. No. 12/748,896, filed Mar. 29, 2010, which is a continuation of, and claims benefit under 35 USC 120 to, international application PCT/EP2008/063170, filed Oct. 1, 2008, which claims benefit of German Application No. 10 2007 047 149.3, filed Oct. 2, 2007 and U.S. Ser. No. 60/976,900, filed Oct. 2, 2007. U.S. application Ser. No. 12/748,896 and international application PCT/EP2008/063170 are hereby incorporated by reference in their entirety.

FIELD

The disclosure relates to an optical membrane element for an optical device in lithography, especially EUV (extreme ultraviolet) lithography, including at least one membrane layer and a frame, which at least partially surrounds the membrane layer and at which at least part of the edge of the membrane layer is mounted, as well as a projection exposure system, especially for EUV lithography, in which a corresponding membrane element is provided, and also a method for the use of such a membrane element and a method for making such an optical membrane element.

BACKGROUND

For the production of the finest structures in electrotechnical and/or micromechanical components on the nanometer scale, it is desirable for light or generally electromagnetic radiation of ever decreasing wavelengths be used for the lithography method underlying the manufacturing process. Accordingly, projection exposure systems for illuminating and imaging a reticle containing the desired microstructure or nanostructure are known that employ electromagnetic radiation in the range of extreme ultraviolet light. For this technique, called EUV lithography, optical membranes are used in order that they may serve, for example, as spectral filters, as described in U.S. Pat. No. 7,154,666 B2. In addition, there are other applications in the field of EUV lithography, such as those described in U.S. Pat. No. 7,153,615, U.S. Pat. No. 6,749,968, U.S. Pat. No. 6,683,936 and U.S. Pat. No. 6,150,060. Because the application areas referred to in these documents constitute potential applications for the optical membrane element of the disclosure, the disclosure content of these publications is incorporated by reference herein in their entirety.

U.S. Pat. No. 5,068,203 furthermore discloses how, for example, a thin silicon membrane may be produced. Its disclosure content, too, is incorporated herein by reference.

The membranes usually have a very low thickness in the range of 50 to 500 nm and are desirably planar and smooth in order that they may be used in optics without causing aberrations. The extended area of the membranes can range from 0.5 mm edge length or diameter to several 100 mm edge length or diameter.

SUMMARY

In some embodiments, the disclosure provides an optical membrane or an optical membrane element which has the desired planarity, i.e. membrane flatness, for use in optics and thus especially avoids wrinkling and the like. In addition, the membrane element can be easy to produce and use while meeting the desired optical properties such as transmission, etc.

The disclosure proceeds from the fundamental idea that a planar, smooth arrangement of an optical membrane is possible if the membrane can be selectively tautened. In the case of optical membranes, such as those made from silicon or zirconium, which inherently have very little or no membrane tension due to the way they are manufactured, the planarity or flatness is impaired because the lack of tension leads to wrinkling. Other membranes, such as those made from silicon nitride, have high production-related membrane tensions, whose unevenness is due to internal tensions or to the membrane's being arranged on a support structure. All these problems can be resolved through selective tautening of the membrane. For example, wrinkling, too, which is due to internal tensions created by coatings, such as zirconium on silicon, can be removed by selective tautening.

The disclosure provides an optical membrane element, which has at least one membrane layer and a frame, which at least partially surrounds the membrane layer and to which is attached or mounted at least part of the edge of the membrane layer. Through the provision of a least one tautening element which can act upon the membrane layer, selective tautening of the membrane layer can be achieved.

Several tautening elements can be distributed around the circumference of the membrane layer and/or the frame in order that an uneven state of tension in the membrane layer may be compensated for by corresponding actuation of individual tautening elements in each direction. Especially, it is advantageous to provide at least two tautening elements for the purpose of introducing tensile forces into the membrane layer in independent spatial directions. A high number of tautening elements makes for more selective and more accurate tautening of the membrane layer.

If the tautening of the membrane layer proceeds via deformation of the frame at which the membrane layer is arranged, it is advantageous for the frame to be capable of corresponding elastic deformation.

Alternatively, or additionally, the frame can be formed from or include a plurality of separate retaining elements, such that the membrane layer can be tautened by a movement of separate, individual retaining elements.

The frame of the membrane layer can be accommodated in a holder, with the tautening elements capable of being provided between the frame and the holder. The tautening elements can be formed as longitudinally adjustable connecting elements between the frame and holder, such that a change of length of the connecting elements generates forces and the tension of the membrane layer is adjustable. Candidate longitudinally adjustable connecting elements may especially be adjusting screws and the like. In addition, however, other actuators, such as piezoelectric elements, and the like may be provided. The tautening elements can also be spring elements, such as tension springs or linear springs.

In some embodiments, the desired tensile forces can be generated on the membrane layer by generating torque in connection with swivel joints, rather than by direct linear movements or displacements. For example, between a holder on one hand and frame or retaining elements on the other, at least one, preferably several swivel joints can be provided which transform a generated torque into a linear force. The desired torque may, for example, be generated in turn by a longitudinally adjustable spacer especially in the form of an adjusting screw or a piezoelectric actuator. Here, too, other actuators which can generate torques may be used.

In addition to a torque, which is converted into a linear tensile force on the membrane layer via a rotary axis parallel to the plane of the membrane layer, other deformations or types of force application can be used to apply tension in the plane of the membrane layer. For example, the frame may be formed as two parts, with a first, inner part is connected to the membrane layer and the second outer part connectable to a holder. The two parts may be connected via spring bars, which, upon elastic deformation, cause the inner part of the frame to expand and thus in turn generate tensile forces in the plane of the membrane layer.

Through the various ways of generating tensile forces or tensile stresses in the plane of the membrane layer, it is possible to stretch the membrane layer and thus to generate a smooth and planar shape of the membrane layer. Especially, the tension of the membrane layer of the membrane element is thus adjustable, with the adjustment relating to both the magnitude and the direction and thus the local distribution of the tension. As a result, unevenness and wrinkling, whether due to an absence or deficiency of tension or to unevenly distributed (inherent) tension, are avoided or compensated for.

The membrane element with corresponding tautening elements thus also allows readjustment of the tension as time passes, for example when relaxation has occurred or when different environmental conditions, such as radiation-induced heating and the like, involve changes.

The optical membrane element can be generated especially by a lithographic manufacturing method in order that, for example, at low membrane dimensions of 0.5 mm edge length or diameter, the correspondingly involved micromechanical components for the tautening elements may be produced. Correspondingly, the membrane layer and the frame as well as the holder and the frame plus the holder, frame and membrane layer can be formed as one piece.

The membrane layer can have a thickness of 50 nm to 500 nm (especially 100 nm to 250 nm), and edge lengths or diameters ranging from 0.5 mm to 200 mm (especially 1 mm to 100 mm).

The membrane layer can have multiple plies and/or include functional elements such as lattice structures and the like as well as filter layers. Accordingly, an optical membrane element can be provided in a projection exposure system, especially an EUV projection exposure system where it may serve as transmission reticle, debris filter, attenuator, spectral filter, pellicle, transmission grid, or transmission filter.

Especially preferred is a use of corresponding membrane elements in connection with measuring devices for recording the optical imaging properties.

The membrane layer can include silicon, zirconium, ruthenium, rhodium, niobium, molybdenum, boron and/or silicon nitride.

An element of the optical membrane element can have a quadratic shape, a rectangular shape, a polygonal shape, a circular shape, or an oval basic shape. The membrane layer has a thickness of 5 nm to 500 nm. The membrane layer can include one of more of functional elements, multiple plies, filter layers and optically active structures.

BRIEF DESCRIPTION OF THE FIGURES

Further advantages, characteristics and features of the disclosure are apparent from the following detailed description of embodiments using the enclosed drawings. The drawings show in purely schematic form:

FIG. 1 is a plan view of a first embodiment of an optical membrane element;

FIG. 2 is a plan view of a second embodiment of an optical membrane element;

FIG. 3 is a cross-section through a membrane element according to FIG. 1 or 2;

FIG. 4 is a plan view of a third embodiment of an optical membrane element;

FIG. 5 is a partial cross-section through the membrane element of FIG. 4;

FIGS. 8a-8c show the sequences involved in lithographic manufacturing of a silicon membrane via an SOI (Silicon On Insulator) wafer;

FIG. 9 is a cross-section of a multi-ply membrane layer;

FIG. 10 is a cross-section of a membrane layer with functional elements;

DETAILED DESCRIPTION

Figure 6:
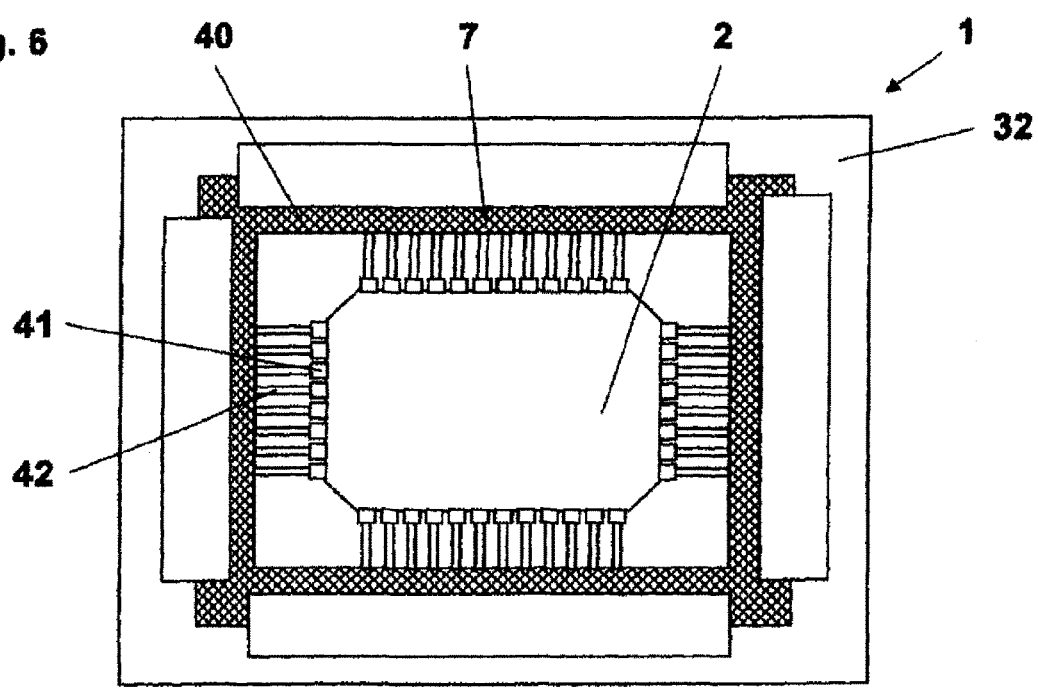
FIG. 6 is a plan view of a fourth embodiment of an optical membrane element.

FIG. 1 is a plan view of a first embodiment of an optical membrane element 1, in which the membrane layer 2 has a rectangular base area or basic shape when the layer thickness is ignored.

The membrane layer 2 is held at the sides of the rectangular basic shape, i.e. the end faces, by retaining elements 3, 4, 5 and 6, which together form a frame 7. Provided in each of the retaining elements 3, 4, 5, 6, is a coupling element in the form of an opening 8, 9, 10, 11, with which a tautening element, not shown in detail, can engage. Via the tautening element and in accordance with the arrows shown at openings 8, 9, 10 and 11, forces are generated which place the membrane layer 2 under tensile stress.

In order that the forces may be generated, the tautening elements can be counter-mounted in a holder, not shown, which, for example, can also be formed by a housing of an optical device, such that, for example, by shortening the tautening elements, for example in the form of adjusting screws and the like, the tension in the membrane layer 2 can be produced.

FIG. 2 shows in an illustration similar to FIG. 1 a further embodiment of a membrane element 1, in which similar or identical components are labelled with the same reference symbols. The embodiment of the membrane element of FIG. 2 differs from that of FIG. 1 in that the membrane layer has an octagonal base area or basic shape instead of a rectangular area. Correspondingly, instead of the four retaining elements 3, 4, 5 and 6 according to the embodiment of FIG. 1, retaining elements 3 to 6 and 17 to 20 are provided, which, depending on the dimension of the longitudinal extension of the side of the membrane layer 2 at which they are arranged, are also formed differently. However, the retaining elements 3 to 6 and 17 to 20 also have corresponding coupling elements 8 to 15 in the form of an opening for engagement with a tautening element, like the retaining elements 3 to 6 of the embodiment of FIG. 1.

FIG. 3 shows schematically in a cross-sectional view the functioning of the optical membrane elements, as illustrated in FIGS. 1 and 2. FIG. 3 shows a cross-section through the retaining elements 3 and 5, more precisely, through the corresponding openings 8 and 10, which serve the purpose of engagement with the tautening elements. If, for example, force, as indicated by the arrows, is exerted on the retaining elements 3 and 5 by shortening the tautening elements (not shown) arranged between the retaining elements 3, 5 and a surrounding holder (not shown), the retaining elements 3 and 5 are caused to move apart. Since the retaining elements 3 and 5, however, are firmly connected to the membrane layer 2, the membrane layer 2 is placed under tensile stress and is pulled apart or is elastically and/or plastically stretched. Typically, the force should be large enough to produce planar smoothing and elastic tautening only, but not to induce plastic strain on the membrane layer.

The arrangement of the membrane layer 2 at the retaining elements 3 to 6 or 17 to 20 can be effected by a positive-locking, or force closure or bonded connection (material continuity), with especially the membrane layer attachable by a clamp, a weld or an adhesive bond. It is also conceivable for the retaining elements to form one piece with the membrane layer, for example in the case of lithographic production of silicon membranes.

Moreover, it is also conceivable for a membrane element to be formed so as to be gastight, with, for this purpose, a holder is provided around the membrane layer 2 and the retaining elements 3 to 6, such as shown in the embodiment of FIG. 4. The holder (not shown) is formed such that the holder can be accommodated gastight in a housing of the projection exposure system. The membrane layer 2, such as provided in embodiments of FIGS. 1 to 3, is also arranged gastight at the holder, such that no membrane-free space remains between the points of attack of the retaining elements 3 to 6 or tautening elements at the membrane and the holder. The tautening elements act in such a manner that an inner area of the membrane layer 2 is tautened by the tautening elements, while the outer area of the membrane layer is connected gastight to the holder 32, but rather than being tautened serves to accommodate the folded parts of the membrane.

FIG. 4 shows a further embodiment of an optical membrane element in which the membrane layer 2 has a circular base area. Correspondingly, the surrounding frame 7 is formed as a circular ring. The frame 7 is surrounded by a holder 32, which includes a plurality of tautening elements 30, which are spaced equidistantly around the membrane layer 2 and the frame 7. The mechanical tautening elements 30 each have a swivel or bending joint 31, which, as a one-piece solid-body joint in the form of a film hinge, connects the holder 32 to the frame 7. Accordingly, the swivel joint 31 is essentially formed by a thin, flexible bar, which connects the frame 7 to the holder 32 as one piece.

The holder 32 is also formed as a circular ring, with an extension 34 being formed in the zone of the mechanical tautening elements 30 in order that an adjusting screw 33 may be arranged at a distance from the swivel joint 31 such that the screw interacts with that part of the frame 7 which is remote from the swivel joint. The interaction proceeds in such a way that the adjusting screw 33 is fed in through a threaded hole in the extension 34 and one of its ends stops against that part of the frame 7 which is spaced apart from the swivel joint 31. Through turning the adjusting screw 33, the distance between the frame part 7 and the extension 34 of the holder 32 can be modified, such that swivelling about the swivel joint 31 occurs. If, as a result, that part of the frame 7 which is spaced apart from the swivel joint 31 moves towards the membrane layer 2, the opposite part of the frame 7 to which the membrane layer 2 is attached, moves outwards and thus exerts a tensile force which acts on the membrane layer 2. Correspondingly, a tensile strain can be exerted on the membrane layer 2. Through adjustment of the adjusting screw 33 at the mechanical tautening elements 30 provided around the membrane layer, a desired tensile strain can be adjusted. Especially, the mechanical tautening elements can be individually adjusted such that a planar, smooth formation of the membrane layer 2 is ensured.

Figure 7A:
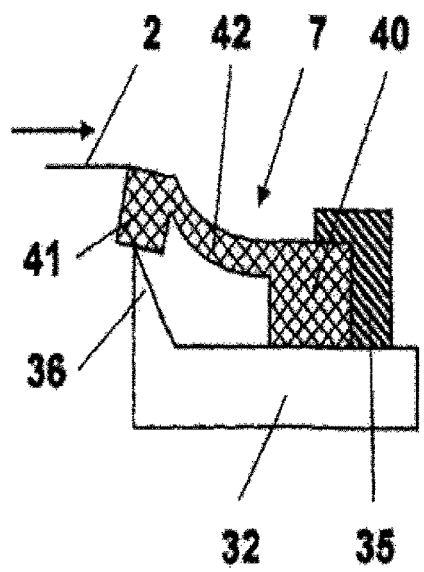
FIG. 7A is a partial cross-section of the membrane element from FIG. 6.
Figure 7B:
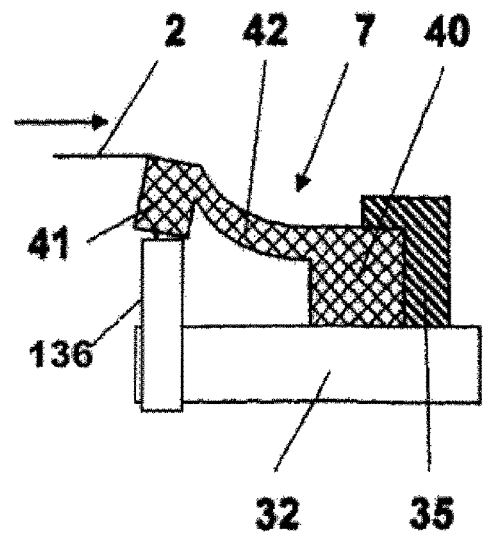
FIG. 7B is a partial cross-section of a membrane element having an adjustable screw element.
Figure 7C:
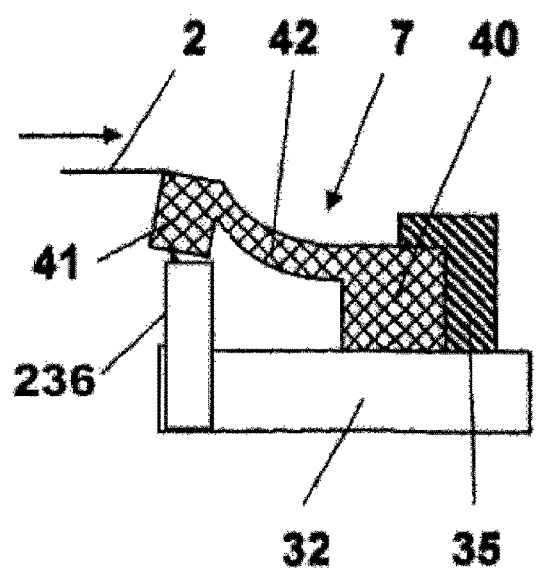
FIG. 7C is a partial cross-section of a membrane element having a piezo actuator.

FIG. 6 shows a fourth embodiment of an optical membrane element 1, which has an essentially rectangular membrane layer 2. The membrane layer 2 is held in a frame 7 which includes an outer frame part 40 in the form of a rectangular ring and an inner frame part 41 with individual retaining elements, which are firmly connected to the membrane layer 2. Between the outer frame part 40 and the inner frame part 41 or the retaining elements 41 are provided spring bars 42, which, as shown in more detail in FIG. 7A, are formed so as to be elastically deformable. Alternatively, an adjustable screw element 136 as shown in FIG. 7B, or a piezo actuator 236 as shown in FIG. 7C can be used instead of the circumferential bar 36 shown in FIG. 7A.

The holder 32, too, consists of a rectangular ring structure in which accommodation elements 35 are provided which can accommodate the outer frame part 40 by clamping. Formed on the inner side of the holder ring 32 is a circumferential bar 36, which interacts with the inner frame part 41 or the retaining elements such that the spring bars 42 are bent perpendicularly to the plane of the membrane layer 2. This leads to expansion of the membrane layer 2 and to the introduction of a corresponding tensile stress.

Through appropriate choice of the height of the circumferential bar 36, a defined stress can be set. In addition, the peripheral bar 36 is formed such that, for example, oblique sliding surfaces or the like ensure that the tension is maintained permanently.

Instead of the circumferential bar 36, it is also conceivable to provide adjusting screws, which are fed, for example, through the holder ring perpendicular to the plane of the membrane layer 2 and, upon accommodation in corresponding threaded holes, can form a defined stop for the inner frame part 41 or the individual separate retaining elements. FIGS. 8a-8c show the procedural method adopted in the lithographic manufacture of a thin silicon membrane with a layer thickness of, for example, 100 nm.

To this end, in the first step, which corresponds to the image of FIG. 8a, a so-called SOI wafer (Silicon-On-Insulator wafer) is provided in which two silicon partial layers 50 and 52 are separated by a partial layer of silicon dioxide 51. A photoresist 53 is applied to the surface of the partial silicon layer 52 so that zone 54 has no photoresist, so that the partial silicon layer there can be etched away in a sub-step in accordance with FIG. 8b). The structure of the photoresist with the resist-free zone 54 is produced by corresponding lithographic exposure of the photoresist and subsequent removal of the uncured photoresist.

After the etch-stop layer of silicon dioxide 51 is reached during etching of the silicon in zone 54, photoresist 53 and the partial silicon dioxide layer 51 in the window area 54 are removed, such that a free-standing silicon membrane remains in zone 54.

Similarly, further steps can be introduced before, after and/or during the membrane production to effect structuring in those zones which surround the window area 54 and which can find use as a frame, in order that mechanical tautening elements may be generated, such as those shown in FIG. 5.

FIGS. 9 and 10 show the basic structure of membrane layers, as can be used in accordance with the disclosure. For example, FIG. 9 shows a two-layer membrane 2, which includes the partial layers 60 and 61, which consist, for example, of silicon and zirconium.

FIG. 10 shows a membrane layer 2 which includes a basic layer 62, for example, of silicon, on which functional elements, such as lattice structures 63 and the like, have been applied.

The optical membrane elements can be used in projection exposure systems for microlithography, that is, in illumination systems or projection optics, more especially in projection exposure systems which work with light, that is, electromagnetic radiation in the extreme ultraviolet range. One possible wavelength here, for example, is 13.5 nm.

Figure 11:
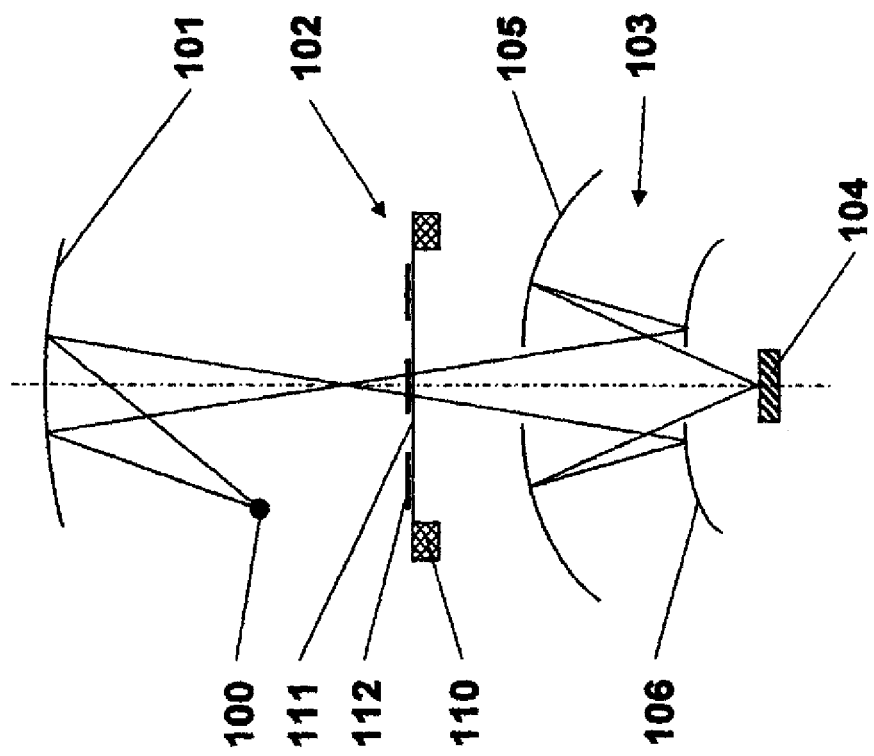
FIG. 11 is an illustration of a projection exposure system, in which an membrane element is used.

The optical membrane elements can be used as transmission reticles 102, wherein a structured absorber 112 is applied to a free-standing membrane 111 from transmitting material, such as silicon or silicon nitride (see FIG. 11). Due to the absorbent structure 112, a structure to be produced on a wafer 104 can be created, which is imaged in miniature onto the wafer via projection optics 103. FIG. 11 further shows the EUV light source 100 and the illuminating system 101.

The transmission reticle 102 includes, in addition to the membrane 111 and the absorber 112 deposited thereon, a tautening device 110 in accordance with the disclosure, which ensures that the membrane 111 is smooth and planar under tension.

Another possible application consists in using corresponding optical membrane elements as debris filters, which serve to isolate one zone of a projection exposure system in which contamination exists or may arise from other zones. For instance, the light source can be segregated from the rest of the projection exposure system through a corresponding debris filter. The debris filter allows passage of the light used for imaging, for example, EUV radiation, but neutral particles or ions cannot pass through the filter.

Another possible use of the optical membrane elements is as spectral filter for filtering out a certain wavelength of the light employed or electromagnetic radiation generally.

Figure 12:
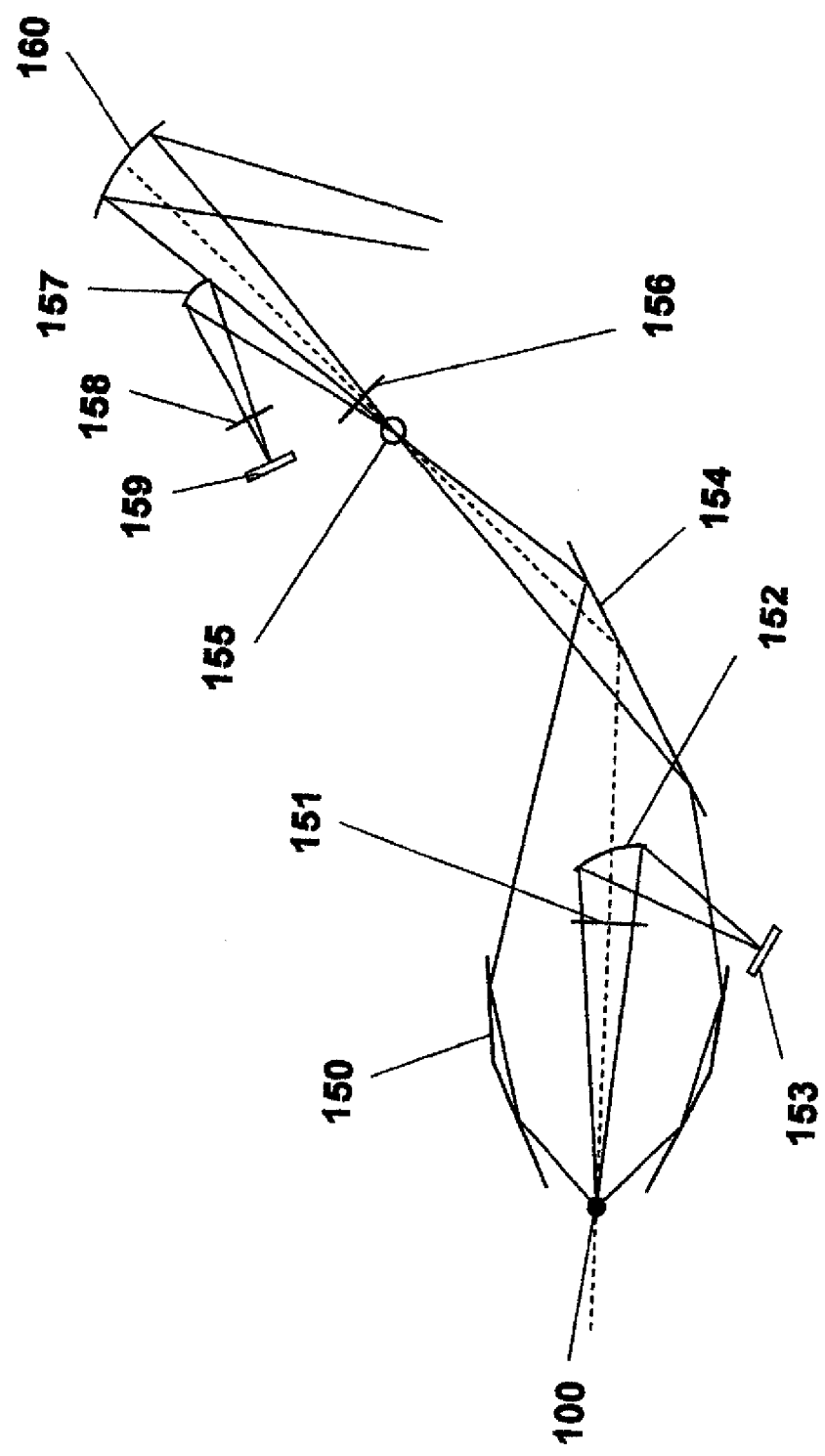
FIG. 12 is an illustration of a part of an illumination system for a projection exposure system with membrane elements.

Corresponding membrane elements can also be used in combination, such as debris filter and spectral filter. This is shown in FIG. 12 for a part of an illumination system for an EUV lithography system. The light of an EUV light source 100 is collected via a so-called Wolter collector 150 and focussed onto a mirror 154, from where it is directed to a further mirror 160 via an intermediate image 155.

A plasma position sensor 153 and an intermediate image position sensor 159 are provided for the purpose of monitoring the illumination system. Corresponding membrane filters 151 and 158 are provided to protect such sensors. Moreover, another debris filter 156 is provided in the vicinity of the intermediate image.

The combined debris spectral filter 151 is arranged in front of a mirror 152, which blocks a portion of the light 150 collected by the Wolter collector from the light source 100 in the direction of the plasma position sensor 153. The plasma position sensor serves to monitor and check the state of the EUV light source 100.

The same applies to the intermediate image position sensor 159, by which the location of the intermediate image can be monitored. To this end, a portion of the light from the beam is blocked via the mirror 157 and deflected to the intermediate image position sensor 159. Provided between mirror 157 and intermediate image position sensor 159 is, again, a combined debris spectral filter 158.

Through the combined debris-spectral filters 151 and 158, unwanted contamination can, for example, be prevented from reaching the sensor and, moreover, a wavelength range of light which is unfavourable for the sensor can also be blocked.

The debris filter 156, in contrast, only takes on the function of preventing contamination from spreading out along the beam.

Figure 13:
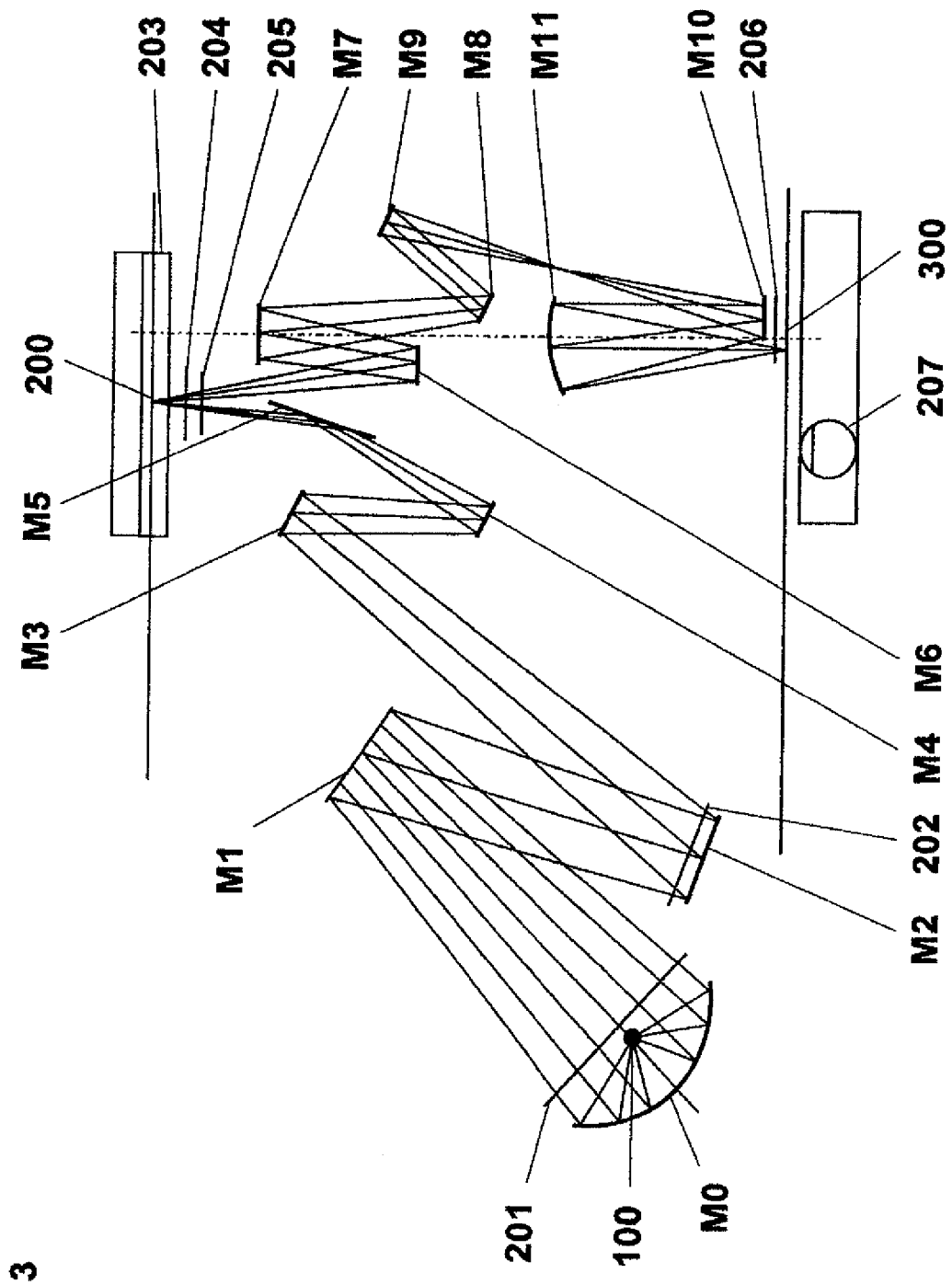
FIG. 13 is a projection exposure system with application areas for membrane elements.

FIG. 13 shows an EUV projection exposure system with an EUV light source 100, whose light is directed to a reticle 200 via the mirror elements M0 to M5, which constitute the illumination system. The reticle 200, which is configured not as a transmission reticle but rather as a reflection reticle, reflects the illumination light, with the structure provided at the reticle 200 being imaged onto a wafer 300 via projection optics having mirror elements M6 to M10.

In the projection exposure system of FIG. 13, various membrane elements in accordance with the present disclosure are provided in the form of debris filters, graduated grey filters, pellicle, spectral filters or in connection with inline measuring technology.

Thus, according to FIG. 13, a first debris filter 201 is arranged relative to the light source 100, such that the particles formed in the light source, such as ions, neutral particles and the like, cannot reach the rest of the projection exposure system.

While the debris filter 201 can be arranged only in the area of the beam, it is advantageous for the debris filter 201 to be formed such that gas-tight separation obtains. Accordingly, a gastight arrangement of the membrane with its frame or its holder in a housing or housing component may be provided.

Since the membrane is usually formed so as to be very thin, the thermal conductivity of the membrane itself is low, such that the membrane heats up upon corresponding absorption of electromagnetic radiation. It is therefore advantageous for the filters or membranes to be placed where the light output per surface element is as low as possible in order that the temperature load may be kept low. It follows therefrom that the corresponding membranes can be formed so as to have a very large surface, a fact which in turn involves the tension for achieving a smooth membrane is particularly important.

Although such debris filters can be used throughout the system, as FIG. 12 has already shown, use with respect to segregation of the light source, as with the debris filter 201, as well as segregation of the projection exposure system relative to the wafer 300 via a debris filter 206 is preferred.

Irradiation of the photosensitive layer on the wafer 300 causes the release of possibly aggressive chemical components, which may lead to impairment of the optical components of the projection system. The debris filter 206 hinders these released chemical components of the wafer or of the layers provided thereon.

In addition, an optical membrane element can also serve as a pellicle 203 for protecting the reticle.

Where the optical membrane serves as pellicle 203, the membrane element is provided in connection with the reticle to protect the latter against particles, which could reach the reticle, especially during handling of the reticle, such as during reticle changing or during transport of the same. Since the pellicle is arranged so as to be spaced apart from the reticle and firmly connected to it, any particles can be deposited on the pellicle only, with, due to the arrangement outside the reticle plane, the particles not being imaged to the same level of sharpness as the structures of the reticle and thus unfolding a less harmful effect. A pellicle membrane could, for example, be made of silicon or zirconium, as these facilitate maximum possible transmission of the EUV light.

A further application for optical membrane elements in accordance with the present disclosure is the use as graduated grey filter 202, 204 for averaging the illumination. The graduated grey filters can be used here either for uniform illumination of the field (graduated grey filter 202) or the pupil (graduated grey filter 204). In the case of the graduated grey filters 202, 204, an absorber layer is provided on the membrane with a gradient across the thickness of the layer, such that non-uniformity of the intensity distribution is compensated. Even lattice structures which lead to averaging of the intensity through a refractive effect are conceivable. The absorber layer can be made of aluminium, chromium, tantalum nitride, carbon or other elements of low transmission for EUV light.

Instead of an absorber layer with thickness gradient or with lattice structure, it is also conceivable for averaging of the light intensity to be adjusted by a dynamic filter, which is formed so as to be displaceable.

Another application area is characterised by the spectral filter 205 intended to filter out light of certain wavelengths. This is for example true for so-called deep ultraviolet radiation, which, for example, is detrimental to the photosensitive layer of the wafer. The spectral filter can basically be provided anywhere in the projection exposure system or, as the embodiment of FIG. 12 shows, be combined with other filters.

There are also possible applications in connection with measuring technology, as already described for FIG. 12. Aside from measurements in the illumination system, as shown in FIG. 12, the optical membranes can also be used for so-called inline measuring technology in the area of the wafer, as illustrated by the membrane element 216, which is shown in detail in FIG. 14.

The so-called inline measuring technology of the wafer stage 212 can take the form of transmission image sensors (TIS) and so-called Ilias sensors (integrated lens interferometers at scanner, ILIAS). Such sensors are described, for example, in EP 1 510 870 A1, which is hereby incorporated by reference in its entirety.

Figure 14:
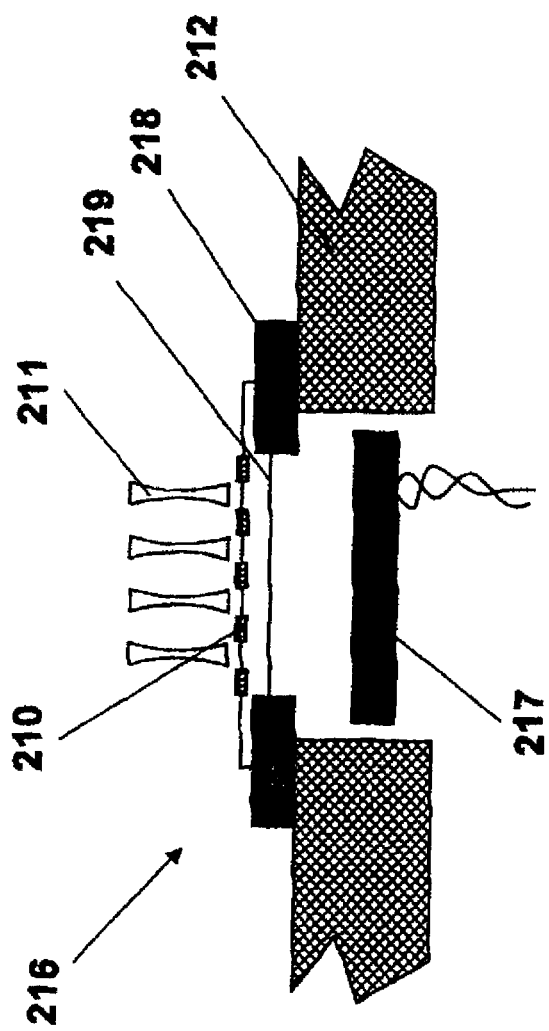
FIG. 14 is a part of a projection exposure system in the wafer stage with an membrane element.

FIG. 14 is a cross-sectional view of the arrangement of a corresponding membrane element 216 with the frame or the tautening device 218 as well as the membrane 219 and the absorber 210 deposited thereon. Below the membrane 219 in the area of the wafer stage 212 (substrate holder) is provided, for example, an intensity sensor or an EUV camera 217.

The structuring of the absorber 210 on the membrane 219 in the form of a lattice, for example, enables the wave front aberration of the EUV radiation 211 to be determined.

In addition to the application possibilities which have been shown in relation to FIGS. 11 to 14, further applications of corresponding membrane optical elements are also possible. These arise for a person skilled in the art from the depiction of the described possible uses and the cited advantages of the optical membrane elements.

Although the present disclosure has been described in detail using the sample embodiments, it is clear to a person skilled in the art that the disclosure is not restricted to these embodiments, but that in the context of the attached claims modifications or amendments are possible. For example, all kinds of different combinations of individual characteristics of the present disclosure can be realized or individual characteristics may be omitted.

What is claimed is:

1. An arrangement, comprising:
a holder;
a frame in the holder;
a swivel joint connecting the holder and the frame;
a membrane having a rim, at least part of the rim being mounted to the frame; and
a tautening element between the frame and the holder,
wherein the tautening element is disposed a distance from the swivel joint so that, during use of the arrangement when the distance between the holder and the frame is modified, the tautening element generates a torque via the swivel joint.

2. The arrangement of claim 1, wherein the tautening element comprises a plurality of tautening elements distributed around at least one circumference selected from the group consisting of a circumference of the membrane and a circumference of the frame.

3. The arrangement of claim 1, wherein the frame is elastically deformable.

4. The arrangement of claim 1, wherein the frame comprises a plurality of separate retaining elements holding the membrane.

5. The arrangement of claim 1, wherein the tautening element comprises at least one member selected from the group consisting of an adjusting screw and a piezo actuator.

6. The arrangement of claim 1, wherein a rotary axis of the swivel joint is parallel to a plane of the membrane.

7. The arrangement of claim 1, further comprising a spring bar, wherein the frame comprises first and second parts, the first part of the frame is connected to the membrane, the second part of the frame is connectable to the holder, and the spring bar is between the first and second parts of the frame.

8. The arrangement of claim 7, wherein the spring bar is in a plane parallel to the membrane.

9. The arrangement of claim 1, wherein the membrane and the frame are monolithic.

10. The arrangement of claim 1, wherein the holder and the frame are monolithic.

11. The arrangement of claim 1, wherein:
a member of the arrangement has a shape selected form the group consisting of a circular shape, quadratic shape, rectangular shape, polygonal shape, and an oval basic shape; and
the member is selected from the group consisting of the membrane, the frame and the holder.

12. The arrangement of claim 1, wherein the membrane has a dimension of from 0.5 millimeter to 200 millimeters, and the dimension is selected from the group consisting of a diameter of the membrane and an edge length of the membrane.

13. The arrangement of claim 1, wherein the membrane has a dimension of from one millimeter to 100 millimeters, and the dimension is selected from the group consisting of a diameter of the membrane and an edge length of the membrane.

14. The arrangement of claim 1, wherein the membrane has a thickness of from five nanometers to 500 nanometers.

15. The arrangement of claim 1, wherein the membrane has a thickness of from 100 nanometers to 250 nanometers.

16. The arrangement of claim 1, wherein the membrane comprises multiple plies.

17. The arrangement of claim 1, wherein the membrane comprises at least one member selected from the group consisting of functional elements, filter layers and optically active structures.

18. The arrangement of claim 1, wherein the membrane comprises at least one component selected from the group consisting of silicon, zirconium, ruthenium, rhodium, niobium, molybdenum, boron and silicon nitride.

19. The arrangement of claim 1, wherein the arrangement is configured to be used in EUV microlithography.

20. The arrangement of claim 1, wherein the arrangement is configured so that, when the tautening element generates a torque via the swivel joint, the frame rotates to modify a tensile strain exerted on the membrane.

21. A system, comprising:
an arrangement, comprising:
a holder;
a frame in the holder;
a swivel joint connecting the holder and the frame;
a membrane having a rim, at least part of the rim being mounted to the frame;
a tautening element between the frame and the holder, wherein:
the tautening element is disposed a distance from the swivel joint so that, during use of the arrangement when the distance between the holder and the frame is modified, the tautening element generates a torque via the swivel joint; and
the system is a microlithography projection system.

22. The system of claim 21, wherein the system comprises a light source, an illumination system and projection optics.

23. The system of claim 22, wherein the arrangement is between the light source and the illumination system along a path of light through the system during use of the system.

24. The system of claim 22, wherein the arrangement is downstream of the projection optics along a path of light through the system during use of the system.

25. The system of claim 22, wherein the arrangement is in the illumination system.

26. The system of claim 22, wherein the arrangement is in the projection optics.

27. The system of claim 21, wherein the arrangement comprises at least one member selected from the group consisting of a transmission reticle, a debris filter, an attenuator, a spectral filter, a pellicle, a transmission grate and a transmission filter.

28. The system of claim 21, wherein the system comprises a first part and a second part, and the first and second parts are separated from each other via a gastight separation at least partially provided via the arrangement.

29. The system of claim 21, wherein the system is an EUV microlithography projection system.

30. The system of claim 21, wherein the arrangement is configured so that, when the tautening element generates a torque via the swivel joint, the frame rotates to modify a tensile strain exerted on the membrane.

* * * * *